United States Patent
Munson

(10) Patent No.: US 10,175,291 B2
(45) Date of Patent: Jan. 8, 2019

(54) METHOD FOR PROTECTING AN ELECTRONIC CIRCUIT BOARD

(71) Applicant: Foresite, Inc., Kokomo, IN (US)

(72) Inventor: Terry L. Munson, Kokomo, IN (US)

(73) Assignee: Foresite, Inc., Kokomo, IN (US)

( * ) Notice: Subject to any disclaimer, the term of this patent is extended or adjusted under 35 U.S.C. 154(b) by 0 days.

(21) Appl. No.: 15/809,039

(22) Filed: Nov. 10, 2017

(65) Prior Publication Data

US 2018/0088171 A1    Mar. 29, 2018

Related U.S. Application Data

(63) Continuation-in-part of application No. 15/294,812, filed on Oct. 17, 2016, now abandoned, which is a continuation of application No. 14/096,095, filed on Dec. 4, 2013, now Pat. No. 9,470,746.

(60) Provisional application No. 61/732,968, filed on Dec. 4, 2012.

(51) Int. Cl.
  *G01R 1/04* (2006.01)
  *G01R 31/28* (2006.01)
  *H05K 3/28* (2006.01)
  *B05D 1/28* (2006.01)

(52) U.S. Cl.
  CPC ....... *G01R 31/2817* (2013.01); *G01R 1/0458* (2013.01); *B05D 1/286* (2013.01); *H05K 3/284* (2013.01)

(58) Field of Classification Search
  CPC . B05D 1/28; B05D 3/254; H05K 3/28; H05K 3/284; H05K 5/0091; H05K 5/065
  USPC .............................................. 427/96.2–96.6
  See application file for complete search history.

(56) References Cited

U.S. PATENT DOCUMENTS

| | | | |
|---|---|---|---|
| 2,394,101 A * | 2/1946 | Phillips | C09D 101/28 427/156 |
| 3,320,657 A * | 5/1967 | Strobel | H05K 3/0002 174/256 |
| 5,270,117 A | 12/1993 | Costello et al. | |
| 5,510,138 A | 4/1996 | Sanftleben et al. | |
| 5,534,571 A | 7/1996 | Aydin et al. | |
| 9,277,638 B2 * | 3/2016 | Flaherty | B23K 35/3613 |
| 2003/0171456 A1 | 9/2003 | Tong et al. | |
| 2014/0272113 A1 | 9/2014 | Flaherty et al. | |

* cited by examiner

*Primary Examiner* — Brian K Talbot
(74) *Attorney, Agent, or Firm* — Woodard, Emhardt, Moriarty, McNett & Henry LLP

(57) ABSTRACT

A method for protecting an assembled circuit board by providing a layer of rosin micro-spheres directly on the components to be protected, heating the micro-spheres to a temperature of about 65° C. for a time sufficient to cause the micro-spheres to flow and the rosin to crosslink, and then allowing the board to cool until the rosin returns to its solid state. The rosin micro-spheres may be put onto the board and components by first loading the microspheres onto a transfer tape and then positioning the transfer tape, microspheres down, over the components to be protected. After the rosin is heated the tape may be removed. The method is effective for protecting assembled boards against airborne S to prevent creep corrosion of the copper metallization, and for protecting against Sn to prevent the formation of tin whiskers in tin-plated or soldered lead-free assemblies.

4 Claims, No Drawings

METHOD FOR PROTECTING AN ELECTRONIC CIRCUIT BOARD

CROSS-REFERENCE TO RELATED APPLICATIONS

This application claims the benefit of U.S. patent application Ser. No. 14/875,790, filed Oct. 6, 2015, which claims the benefit of U.S. Provisional Patent Application No. 62/060,069, filed Oct. 6, 2014. The entire contents of each of the related applications are hereby incorporated herein by reference.

BACKGROUND TO THE INVENTION

Conformal coatings are applied to electronic circuitry to protect against moisture, dust, chemicals, and other environmental hazards. Such coatings are typically made from acrylic resin, epoxy resin, urethane resin, or silicone resin. However, as electronic hardware is used in increasingly harsh environments, the failure rate of known coatings has not been satisfactory.

Rosin flux compositions are known to be useful for soldering components to a circuit board. Such flux compositions comprise rosin and one or more flux activators to provide an unoxidized, wettable metal surface that is suitable for the soldering process. As with solder fluxes generally, these rosin flux compositions are applied to electronic components before or during the mounting process.

A need continues to exist for improved coatings to protect electronic circuitry from the adverse effects of moisture, dust, chemicals, and other environmental hazards. The present invention addresses that need.

SUMMARY OF THE INVENTION

One aspect of the present invention provides methods for protecting an electronic circuit board. The method comprises A method for protecting an assembled circuit board, comprising:
  a) providing a plurality of rosin micro-spheres;
  b) putting a layer of said rosin micro-spheres onto electronic components assembled on a board;
  c) heating the rosin micro-spheres to a temperature of at least 55° C. for a time sufficient to cause said microspheres to flow and for the rosin to crosslink, and thus to create a rosin-coated board; and
  d) cooling the rosin-coated board for a time sufficient for the coating to assume its solid state.

In one embodiment the rosin micro-spheres are put onto the electronic components by first loaded the microspheres onto a flexible sheet material and then positioning the flexible sheet material over the components to be protected, with the microspheres directly contacting the components and the flexible sheet material holding the microspheres in position.

The rosin micro-spheres may have a diameter of 2 mm to 5 mm.

The heating step may heat the microspheres to a temperature of between about 55° C. and about 85° C., with about 65° C. being most preferred, for a time sufficient for the rosin to flow and crosslink.

The flexible sheet material may be a polyimide tape with a silicone adhesive.

DESCRIPTION OF PREFERRED EMBODIMENTS

For the purposes of promoting an understanding of the principles of the invention, reference will now be made to certain embodiments and specific language will be used to describe the same. It will nevertheless be understood that no limitation of the scope of the invention is thereby intended, with such alterations and modifications to the illustrated device being contemplated as would normally occur to one skilled in the art to which the invention relates.

As indicated above, one aspect of the present invention provides methods for protecting an electronic circuit board. These methods generally comprise applying a layer of rosin micro-spheres to an assembled board, or to components mounted on a board, and subsequently heating the microspheres to a temperature and for a time sufficient to cause the micro-spheres to flow. The assembly is then allowed to cool to provide a protective barrier over and around the board and/or selected components.

In some embodiments the method comprises providing the rosin-containing composition as a protective coating over all or selected parts of the surface of a board. In these embodiments the rosin coating composition is applied over and between the various electronic components.

In other embodiments the method comprises providing the rosin coating as an underfill to a mounted electronic component.

The coating may be applied to all or part of a circuit board. In some embodiments the entire board is coated after all of the processing work is complete. In other embodiments only selected portions of the board are coated after the components desired to be protected are mounted on the board.

As used herein, "rosin" means a solid form of resin obtained from plants, typically conifers, produced by heating fresh liquid resin to vaporize the volatile liquid terpene components. Gum rosin (from pine tree oleoresin), wood rosin (obtained by extraction of tree stumps), and tall oil rosin (obtained from tall oil, a byproduct of the kraft paper process), and/or clarified esters obtained from such rosins, may be used as desired.

One preferred rosin comprises or consists essentially of a chemical of the formula:

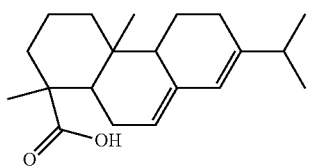

$C_{20}H_{30}O_2$
Exact Mass: 302.22
Mol. Wt.: 302.45
C, 79.42; H, 10.00; O, 10.58

One step in the preferred inventive process is to assemble or provide an electronic circuit board assembly. As is known to the art such circuit board assemblies may be printed circuit board assemblies, and may include functional components such as BGAs, QFNs, LCCs, diodes, resistors, and connectors.

After the circuit board is assembled or provided, the inventive protective coating is applied. In one embodiment the coating is applied by The inventive process is preferably used to treat or protect an entire board, including substantially all of the exposed surface(s) of the board. In other embodiments the inventive process may be used to treat or protect only selected portions of an electric circuit board.

Repair of a component that has been protected by the inventive coatings and processes is easy since solder can be applied or removed through the coating.

The inventive process provides a barrier against environmental contamination and/or corrosive residues. In particular, the inventive process may provide a barrier against one or more of environmental moisture, sulfur gasses, chlorine gasses, and bromide gasses. Additionally or alternatively, the inventive process may provide a barrier that binds up fabrication and assembly residues and reduces or eliminates their impact on electronic circuit performance.

To test the inventive coatings and processes modeling clay was provided on the surface of two fully processed circuit boards. One board was a control and did not have the inventive coating applied. The other board was a test board that did have the inventive coating applied. Both boards were heated in a 70° C. oven in a sulfur rich environment. Copper sulfide corrosion appeared on exposed copper and silver surfaces of the untreated (control) board. Copper sulfide corrosion did not appear on any exposed copper and silver surfaces of the treated (test) board.

Another embodiment of the inventive method comprises providing the rosin coating composition as an underfill to a mounted electronic component. In these embodiments the rosin coating composition is applied under an electronic component, preferably by microdispensing.

In a further embodiment of the present invention the rosin is provided as solid microspheres of soft rosin that are put in a thin layer over the components and/or board to be protected. The microspheres are then heated to their flow temperature for a time sufficient to allow the microspheres to change from their solid state to a liquid state, and then to flow into a thin layer of rosin. The layer of rosin is then cooled to provide a solid protective layer of rosin over the components and/or board to be protected.

The microspheres are preferably 100% rosin, and are preferably 2 mm to 5 mm in diameter. The rosin microspheres may be made by conventional methods such as an atomizer.

The microspheres are preferably positioned on the board or components to be protected by first putting the microspheres on a transfer tape and then putting the transfer tape, microspheres "down," on the board. The transfer tape may be a polyimide tape with a silicone adhesive, such as Kapton tape. In the most preferred embodiment the transfer tape holds a single layer of microspheres, so that a single layer of microspheres is applied to the components and/or board.

The microspheres and tape are heated to a temperature effective to cause the microspheres to change from their solid state to a liquid state, and thus to flow into a homogenous layer of rosin that covers the component or board to be protected. In some embodiments the microspheres are heated to a temperature of between 50° C. and 85° C., most preferably about 65° C., for a time sufficient to allow the material to flow. In one preferred embodiment the microspheres are heated to a temperature of about 65° C. for at least about 15 minutes, and optionally for one hour. At that time and temperature the microspheres flow and cross-link sufficiently to provide an effective coating.

The heat step may be accomplished by any of several heating methods, such as with hot air. The hot air may be provided by a heat gun or in an oven, either of which may be preferable depending on the scale of the operation.

After the microspheres have been heated sufficiently, the transfer tape is removed and the material is allowed to cool until the rosin returns to a solid state and provides an effective coating over the components and/or board. Cooling at ambient temperature for 15-20 minutes is frequently effective for that purpose.

The result of the inventive process is a smooth, continuous coating that protects the components and/or board against airborne S that may otherwise cause creep corrosion of the copper metallization. The inventive process is also effective for protecting against Sn, and is particularly effective to prevent or stop the formation of tin whiskers in tin-plated or soldered lead-free assemblies.

It is to be appreciated from the above that the inventive method may be used to protect any soldered assembly, including leaded or lead-free assemblies. In contrast to prior art technologies, the inventive method may be used to treat a complete, soldered board, and not just an unsoldered board.

While the invention has been illustrated and described in detail in the foregoing description, the same is to be considered as illustrative and not restrictive in character, it being understood that only certain preferred embodiments have been shown and described and that all changes and modifications that come within the spirit of the invention are desired to be protected. In addition, it is to be appreciated that the present invention may comprise or consist essentially of any or all of the illustrated or described elements and/or features, and may comprise or consist essentially of any combination of the disclosed elements and/or features.

The invention claimed is:

1. A method for protecting an assembled circuit board, comprising:
   a) providing a plurality of rosin micro-spheres;
   b) putting a layer of said rosin micro-spheres onto electronic components assembled on a board;
   c) heating the rosin micro-spheres to a temperature of at least 55° C. for a time sufficient to cause said microspheres to flow and for the rosin to crosslink, and thus to create a rosin-coated board; and
   d) cooling the rosin-coated board for a time sufficient for the coating to assume its solid state;
   wherein the rosin micro-spheres are put onto the electronic components by first loading the microspheres onto a flexible sheet material and then positioning the flexible sheet material over the components to be protected, with the microspheres directly contacting the components and the flexible sheet material holding the microspheres in position.

2. The method of claim 1 wherein said rosin microspheres have a diameter of 2 mm to 5 mm.

3. The method of claim 1 wherein said heating step heats the microspheres to a temperature of about 65° C. for a time sufficient for the rosin to flow and crosslink.

4. The method of claim 1 wherein the flexible sheet material is a polyimide tape with a silicone adhesive.

* * * * *